(12) United States Patent
Lee

(10) Patent No.: US 6,472,245 B2
(45) Date of Patent: Oct. 29, 2002

(54) IMAGE SENSOR FORMING METHOD CAPABLE OF DEFINING CONNECTION WINDOW STRUCTURE BY ETCHING FIELD OXIDE

(75) Inventor: Won-Ho Lee, Kyoungki-do (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/941,256

(22) Filed: Aug. 28, 2001

(65) Prior Publication Data

US 2002/0025596 A1 Feb. 28, 2002

(30) Foreign Application Priority Data

Aug. 31, 2000 (KR) ...................................... 2000-051352

(51) Int. Cl.⁷ ............................................... H01L 21/00
(52) U.S. Cl. ........................... 438/59; 438/200; 438/444
(58) Field of Search ........................... 438/57, 59, 200, 438/217, 225, 443, 444

(56) References Cited

U.S. PATENT DOCUMENTS 6,291,280 B1 * 9/2001 Rhodes ...................... 438/200
6,329,218 B1 * 12/2001 Pan ............................. 438/57
6,350,127 B1 * 2/2002 Chiang et al. ................ 438/59

* cited by examiner

*Primary Examiner*—Chandra Chaudhari
(74) *Attorney, Agent, or Firm*—Marshall, Gerstein & Borun

(57) ABSTRACT

An image sensor includes a photo diode having a first region of a first dopant type formed within a semiconductor substrate and a second region of a second dopant type common to said semiconductor substrate, in which the top side of the second region is exposed on the upper surface of the semiconductor substrate. A method for manufacturing the image sensor is disclosed which includes the steps of: forming a field oxide on the semiconductor substrate; etching selectively the field oxide in contact with the photo diode region to expose a portion of the semiconductor substrate between the etched field oxide and the photo diode region; and forming a connection window for connecting the second region of the photo diode to the semiconductor substrate by ion-injecting the first dopant into the exposed portion of the semiconductor substrate between the etched field oxide and the photo diode region.

5 Claims, 6 Drawing Sheets

IMAGE SENSOR FORMING METHOD CAPABLE OF DEFINING CONNECTION WINDOW STRUCTURE BY ETCHING FIELD OXIDE

FIELD OF THE INVENTION

The present invention relates generally to an image sensor forming method and, more particularly, to an image sensor forming method capable of defining a connection window structure by etching a field oxide.

DESCRIPTION OF THE PRIOR ART

An image sensor is an apparatus for converting optical information of one or two dimensions, to an electrical signal. Image sensors may be provided with a pick up tube and a solid state imaging device, for example. The pick up tube has been developed and applied in areas of measurement, control and recognition that employ image processing techniques and can be similar to what is used in the television industry. There are two kinds of devices commercially available as the solid state imaging device, MOS-based (Metal-Oxide-Semiconductor) detectors and CCDs (charge coupled devices).

The CMOS image sensor is a device for converting an optical image to an electrical signal, by using a CMOS manufacturing technique. CMOS image sensors employ switching schemes for detecting sequential outputs by using numerous MOS transistors per unit pixel. The CMOS image sensor is simpler to drive and more versatile in scanning than the widely used conventional CCD image sensor. Furthermore, the CMOS image sensor can integrate a signal processing circuit on a single chip, resulting in a smaller product of lower cost and reduced power consumption.

FIG. 1 is a circuit diagram showing schematically a unit pixel detection structure of a conventional CMOS image sensor, in which the unit pixel comprises a photo diode PD for photo sensing and 4 NMOS transistors. A transfer transistor Tx transports photo charge to a floating diffusion region; a reset transistor Rx draws out the charge at the floating diffusion region for signal detection; a drive transistor Dx acts as a source follower; and a select transistor Sx is for switching and addressing. In FIG. 1, Cf represents the capacitance of the floating diffusion region and Cp represents the capacitance of the photo diode.

The operation of the image sensor unit pixel above will now be described. At first, during unit pixel reset, the reset transistor Rx, the transfer transistor Tx and the select transistor Sx are turned on. At this time, the photo diode PD starts to be depleted so that carrier charging occurs at the capacitance Cp and carrier charging builds up to a voltage VDD at the capacitance Cf in the floating diffusion region. After turning off the transfer transistor Tx, the reset transistor Rx is turned off, while the select transistor Sx is left on. During this operation after an output voltage V1 from the unit pixel output Out is read and buffered, the carriers of the capacitance Cp, are transported to the capacitance Cf by turning on the transfer transistor Tx. After another output voltage V2 from the output Out is read, an analog data value corresponding to V1-V2 is converted to a digital data value.

FIGS. 2A to 2D show processing sectional diagrams for a conventional method of forming CMOS image sensors. Hereinafter, problems associated with the conventional CMOS image sensor manufacturing method will be described, with reference to these figures.

As shown in FIG. 2A, a field oxide 21 is formed on a p-type silicon substrate 20 and a gate insulation film 22 and a gate electrode 23 of the transfer transistor are additionally formed, as shown.

Next, as shown in FIG. 2B, a first photo resist pattern PR1 is formed for forming an n-type impurity ion injection region of the photo diode PD into the p-type silicon substrate 20. The incident n-type dopant, or impurity, is shown by arrows.

Next, as shown in FIG. 2C, after oxide film spacers 25 are formed on side walls of the gate electrode 23, such as by eliminating the first photo resist pattern PR1 and etching an oxide film layer placed on the p-type silicon substrate 20, a second photo resist pattern PR2 for exposing the p-type silicon substrate 20 and the previously formed n-type silicon substrate 24 is formed. A p-type impurity is then injected.

From this p-type impurity ion injection processing, as shown in FIG. 2D, a first p-type impurity ion injection region 26 is formed with a top side exposed on the upper surface of the p-type silicon substrate 20 and a bottom side in contact with the n-type impurity ion injection region 24 is formed. This p-type region 26 constructs the photo diode along with the n-type impurity ion injection region 24. A second p-type impurity ion injection region 27 electrically connecting the p-type impurity ion injection region 26 and the p-type silicon substrate 20 is formed by ion-injecting p-type impurity into the p-type silicon substrate 20 between the leftmost field oxide 21 and the n-type impurity ion injection region 24.

The second p-type impurity ion injection region 27 serves as a connection window for matching the potentials of the first p-type impurity ion injection region 26 and the p-type silicon substrate 20.

In order to form the second p-type impurity ion injection region 27, the n-type impurity ion injection region 24 and the leftmost field oxide 21 of the photo diode should be spaced by a width equal to that of the second impurity ion injection region 27. This detrimentally results in a smaller n-type impurity ion injection region 24, which leads to reduced charge capacity of the photo diode and a reduced saturation level of the CMOS image sensor.

Additionally, during formation of the n-type impurity ion injection region 24, if the first photo resist pattern PR1 is mis-aligned, then the width of the second p-type impurity ion injection region 27 is affected. In fact the second p-type impurity ion injection region 27 may not be formed at all depending on the mis-alignment, in which case the first p-type impurity ion injection region 26 and the n-type impurity ion injection region 24 would not operate as photo diode, but only as a simple p-n junction.

SUMMARY OF THE INVENTION

In accordance with an aspect of the present disclosure, there is provided a method for manufacturing an image sensor including a photo diode having: (a) a first region formed with a first dopant type, the first region being formed within a semiconductor substrate having a second dopant type, and (b) a second region formed with the second dopant type, whereby a top side of the second region is exposed on the surface of the semiconductor substrate, the method comprising the steps of; forming a field oxide on the semiconductor substrate; etching selectively the field oxide in contact with the photo diode to create an exposed portion between the etched field oxide and the photo diode region; and forming a connection window region for connecting the second region of the photo diode to the semiconductor substrate by ion-injecting the second dopant into the semiconductor substrate defined by the exposed portion.

In accordance with another aspect of the present disclosure, there is provided a method for manufacturing an image sensor including a photo diode for photo sensing and a transfer transistor for transferring photo charge from the photo diode to a signal processing region, the method comprising the steps of: (a) forming a field oxide on a semiconductor substrate having a first dopant; (b) forming a first region of the photo diode by ion-injecting a second dopant selectively into the semiconductor substrate between the field oxide and the transfer transistor; (c) etching selectively the field oxide in contact with the photo diode to expose a portion of the semiconductor substrate between the etched field oxide and the photo diode region; (d) forming the second region of the photo diode by ion-injecting the first dopant into the first region of the photo diode, such that an upper surface of a top side of the second region is exposed on the semiconductor substrate and a bottom side of the second region is in contact with the first region of the photo diode; and (e) forming a connection window region connecting the second region of the photo diode to the semiconductor substrate by ion-injecting the first dopant into the exposed portion of the semiconductor substrate.

BRIEF DESCRIPTION OF THE DRAWINGS

The disclosed method will now be described in conjunction with the accompanying drawings, in which.

DETAILED DESCRIPTION OF THE PREFERRED EMBODIMENTS

In the method illustrated in FIGS. 3A to 3E, an image sensor including a photo diode that has a first impurity ion injection region formed within a semiconductor substrate and a second impurity ion injection region of which a top side is exposed on the upper surface of the semiconductor substrate and a bottom side is in contact with the first impurity ion injection region, is manufactured by etching a field oxide adjacent to the photo diode to expose the semiconductor substrate surrounding the photo diode and then ion-injecting the second impurity to form a connection window for electrically connecting the semiconductor substrate and the second impurity ion injection region. In this way, a connection window is defined between the etched field oxide and the photo diode more accurately and formed more selectively so that area of the photo diode size can be increased.

Figure 1:
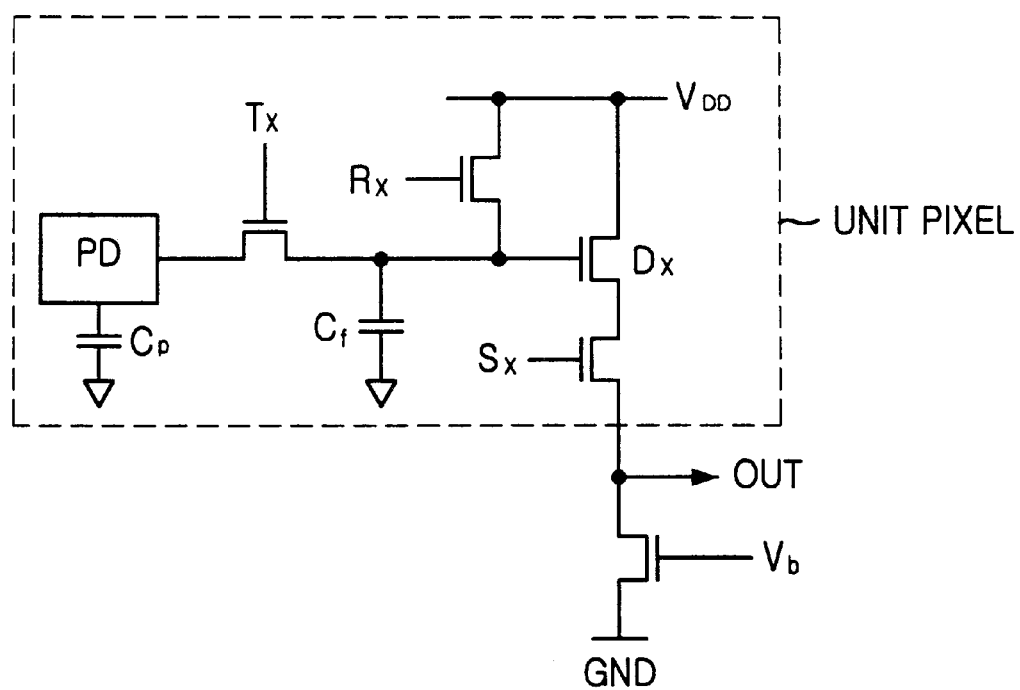
FIG. 1 is a circuit diagram showing schematically a single unit pixel detection structure of a conventional CMOS image sensor.
Figure 2A:
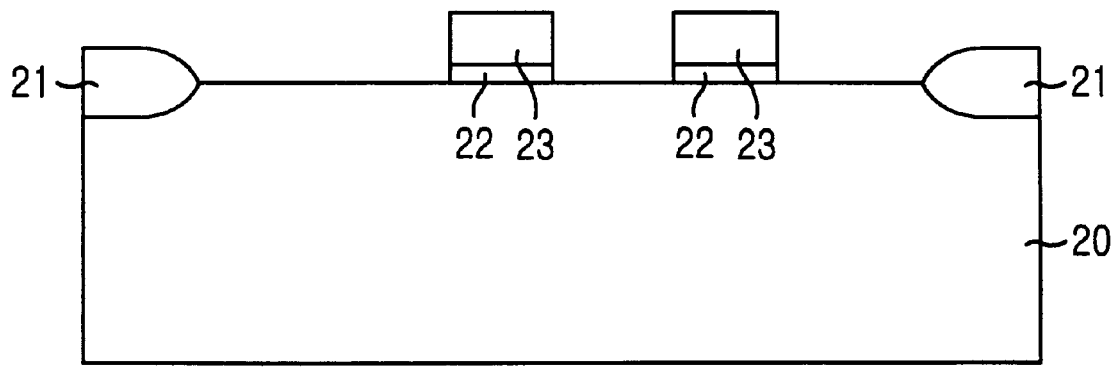
FIGS. 2A to 2D show processing sectional diagrams for conventional formation of a diode region for photo sensing and a transfer transistor for photo charge.
Figure 2B:
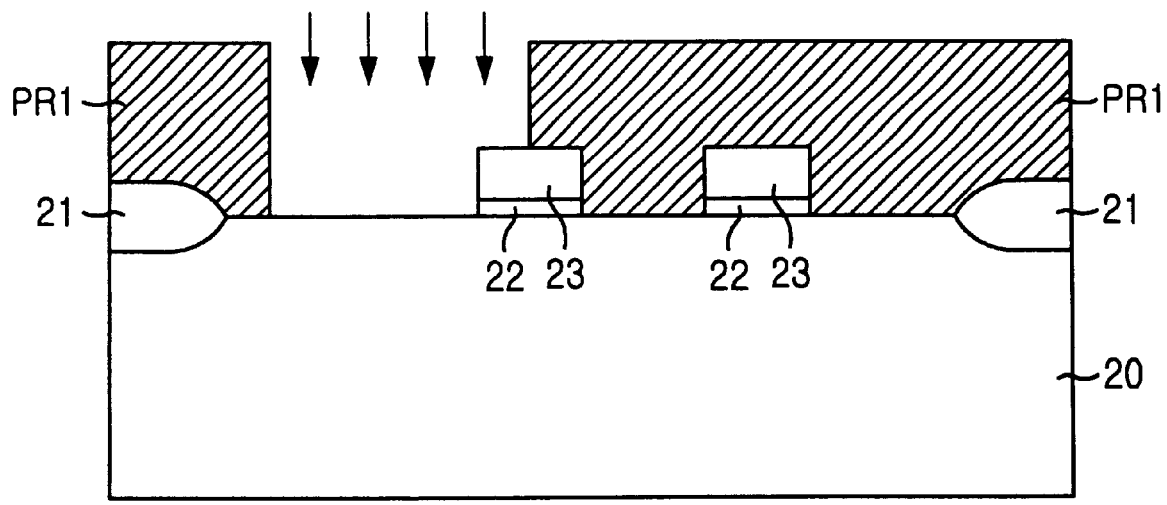
Figure 2C:
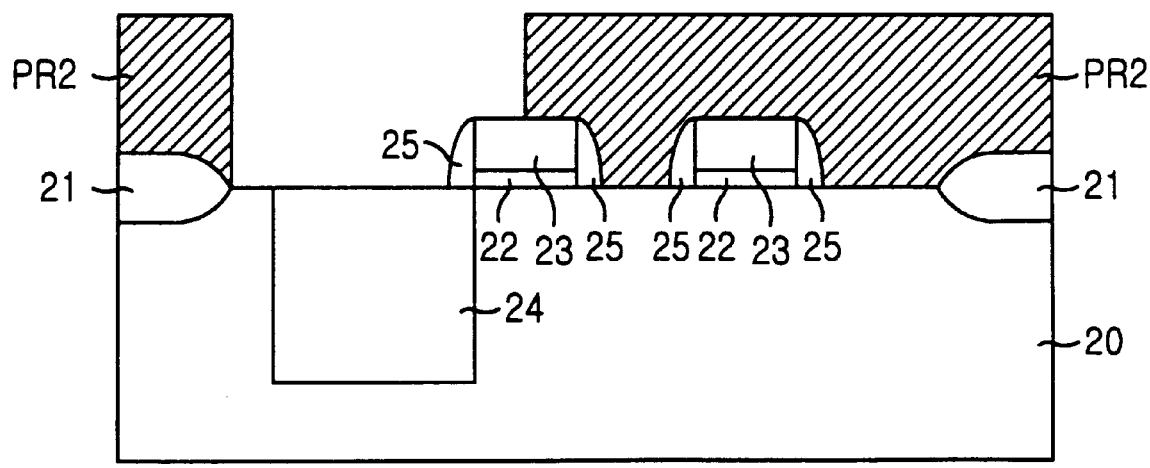
Figure 2D:
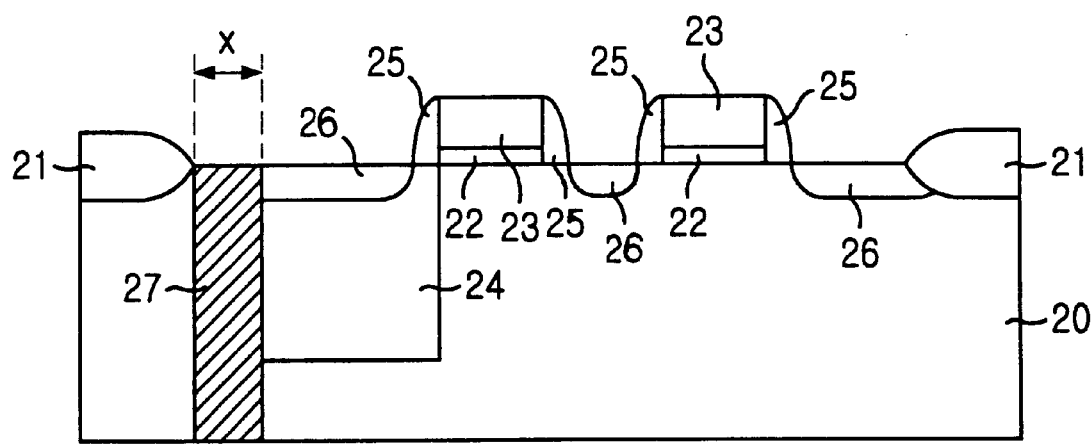
Figure 3A:
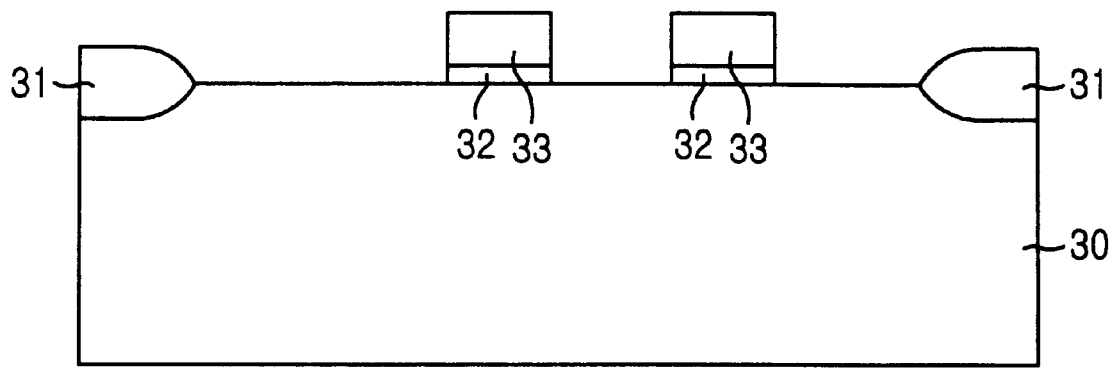
FIGS. 3A to 3E are processing sectional diagrams for an exemplary CMOS image sensor forming method performed in accordance with teachings of the present invention.

At first, as shown in FIG. 3A, a field oxide 31 and a field oxide 31' are formed on a p-type silicon substrate 30 and then a gate insulating film 32 and a gate electrode 33 of a transfer transistor are formed. The thicknesses of the field oxides 31 and 31 are determined depending on later etching processing.

Figure 3B:
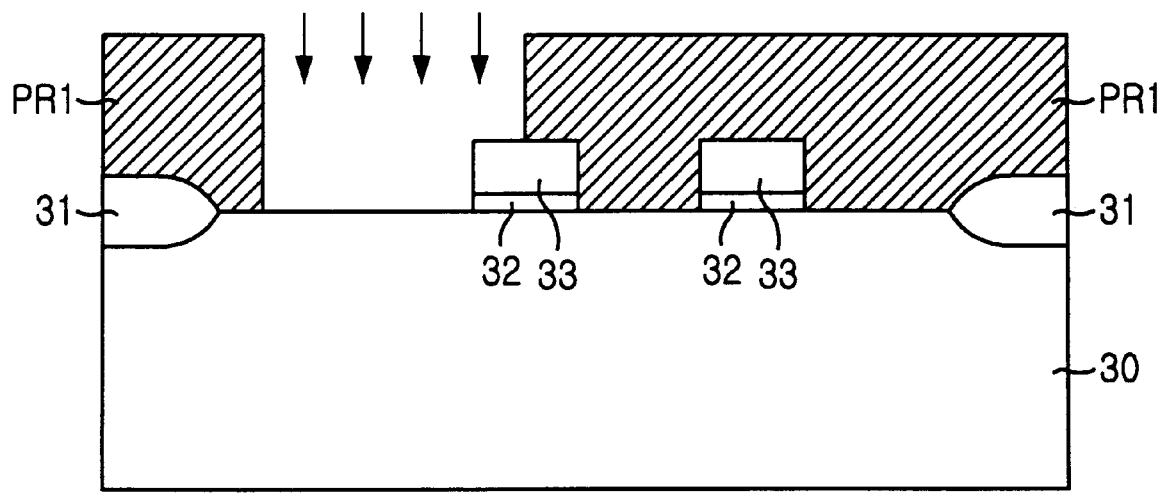

Next, as shown in FIG. 3B, an ion injection mask first photo resist pattern PR1 for exposing a portion of the p-type silicon substrate 30 between the gate electrode 33 of the transfer transistor and the leftmost field oxide 31 is formed to form an n-type impurity ion injection region 34 (FIG. 3C) of the photo diode, once the n-type impurity is ion-injected into the p-type silicon substrate 30.

Figure 3C:
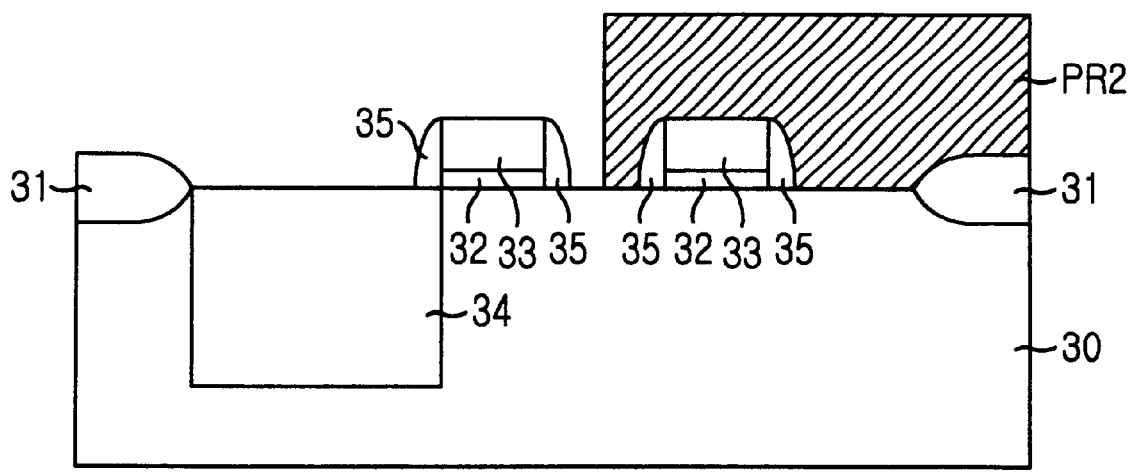
Figure 3D:
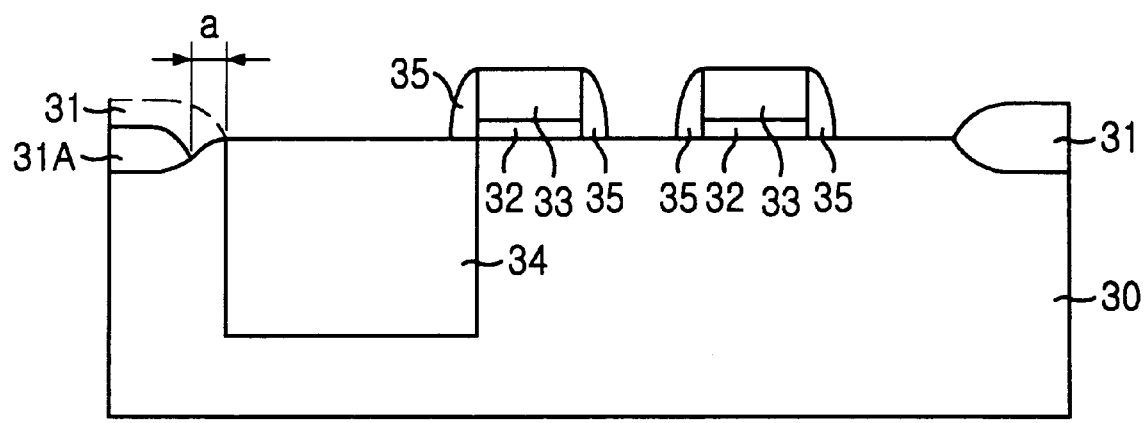

As shown in FIG. 3C, after the n-type impurity ion injection region 34 is formed, an oxide film deposition on the whole surface and etching are processed to form oxide film spacers 35 on side walls of the gate electrode 33. Next, a second photo resist pattern PR2, leaving the leftmost field oxide 31 in contact with the photo diode exposed, is deposited. Though the second photo resist pattern PR2 exposes the gate electrode 33 of the transfer transistor and its peripheral in FIG. 3C, an alternative photo resist pattern can be formed to expose only the leftmost field oxide 31. Oxide film etching, hereafter, reduces the size of leftmost field oxide 31 to field oxide 31A, as indicated, and then the second photo resist pattern PR2 is removed, to achieve the structure shown in FIG. 3D.

A portion of the p-type silicon substrate 30 between the n-type impurity ion injection region 34 and the field oxide 31A is left exposed, as indicated by width a. The width a defines the connection window structure. Although the second photo resist pattern PR2 as shown in FIG. 3C is used as the etching mask, the oxide film spacers 35 of the side walls of the transfer transistor gate electrode 33 are not eliminated because they were formed by etching.

Figure 3E:
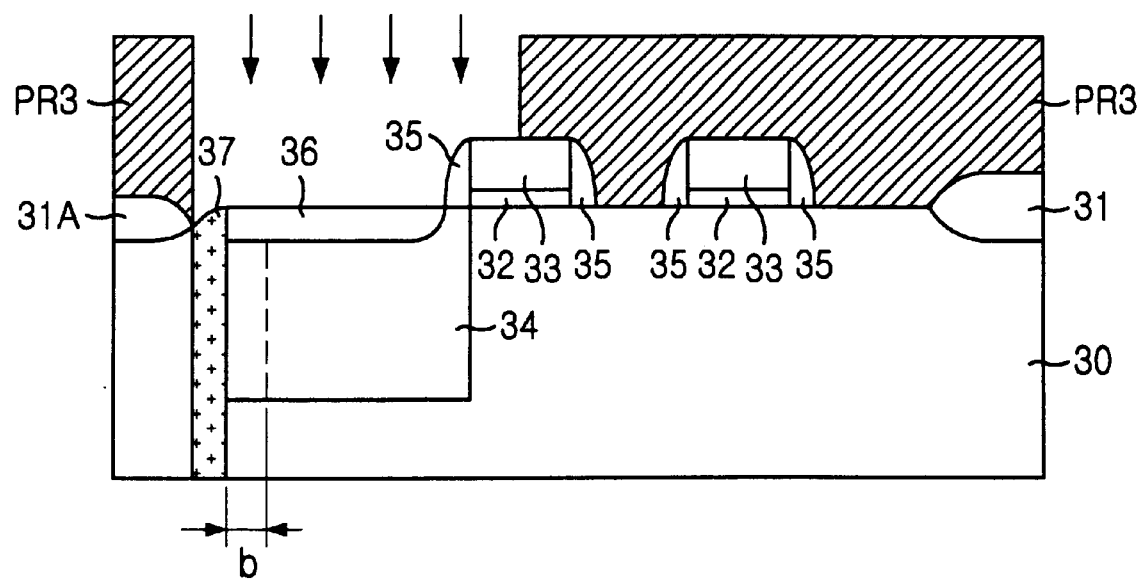

Next, as shown in FIG. 3E, a third photo resist pattern PR3 exposing the p-type silicon substrate 30 between the etched field oxide 31A and the n-type impurity ion injection region 34 is formed; and then a p-type impurity is ion-injected.

By the p-type impurity ion injection processing as described above, as shown in FIG. 3E, a first p-type impurity ion injection region 36 constructing the photo diode along with the n-type impurity ion injection region 34 is formed. The region 36 has a top side exposed on the upper surface of the p-type silicon substrate 30 and bottom side in contact with the n-type impurity ion injection region 34. Simultaneously, a second p-type impurity ion injection region 37 for electrically connecting the p-type impurity ion injection region 36 to the p-type silicon substrate 30 is formed, ion-injecting between the etched field oxide 31A and the n-type impurity ion injection region 34. And then, the third photo resist pattern PR3 is eliminated.

As described above, in forming the second p-type impurity ion injection region 37, i.e., the connection window structure between the field oxide 31A and the photo diode 34, 36 after the leftmost field oxide 31 has been reduced in size, the connection window structure can be separately formed, defined, and ion-implanted from the n-type impurity ion injection region 34 formation. Therefore, the problems that occurred due to mask mis-alignment in forming the region 34 can be solved. And also, by preparing region 37 for forming the connection window structure by eliminating some portion of the leftmost field oxide 31, the area of the photo diode 34, 36 can be increased, e.g., by width b, so as to improve charge capacity of the photo diode and the saturation level of the image sensor.

From the foregoing, persons of ordinary skill in the art will appreciate that provided is a method for manufacturing an image sensor including a photo diode having a first region with a first dopant, or impurity, formed within a semiconductor substrate, having a second region with a second dopant, whereby the top side of the second region is exposed on the upper surface semiconductor substrate and the bottom side is in contact with the first region, and a connection window structure for electrically connecting the semiconductor substrate and the second region, thereby increasing the area of the photo diode.

While the teachings of the present invention have been explained with respect to particular examples, it will be apparent to those of ordinary skill in the art that the scope of this patent is not limited to the disclosed examples. On the contrary, this patent covers all methods and/or structures falling within the scope of the appended claims.

What is claimed is:

1. A method for manufacturing an image sensor including a photo diode having: (a) a first region formed with a first dopant type, the first region being formed within a semiconductor substrate having a second dopant type, and (b) a second region formed with the second dopant type, whereby a top side of the second region is exposed on the surface of the semiconductor substrate, the method comprising the steps of;

forming a field oxide on the semiconductor substrate;

etching selectively the field oxide in contact with the photo diode to create an exposed portion between the etched field oxide and the photo diode region; and forming a connection window region for connecting the second region of the photo diode to the semiconductor substrate by ion-injecting the second dopant into the semiconductor substrate defined by the exposed portion.

2. The method as recited in claim 1, further comprising the steps of:

(a) forming the first region of the photo diode by ion-injecting said first dopant selectively into the semiconductor substrate; and (b) forming the second region of the photo diode by ion-injecting the second dopant into the first region of the photo diode, such that a bottom side of second region is in contact with the first region of the photo diode.

3. The method as recited in claim 2, wherein step (b) further comprises the steps of:

forming a photo resist pattern exposing the upper surface of the first region of the photo diode and the exposed portion between the etched field oxide and the first region of the photo diode;

ion-injecting the second dopant by using the photo resist pattern as an ion-injection mask; and removing the photo resist pattern.

4. A method for manufacturing an image sensor including a photo diode for photo sensing and a transfer transistor for transferring photo charge from the photo diode to a signal processing region, the method comprising the steps of:

(a) forming a field oxide on a semiconductor substrate having a first dopant;

(b) forming a first region of the photo diode by ion-injecting a second dopant selectively into the semiconductor substrate between the field oxide and the transfer transistor;

(c) etching selectively the field oxide in contact with the photo diode to expose a portion of the semiconductor substrate between the etched field oxide and the photo diode region;

(d) forming the second region of the photo diode by ion-injecting the first dopant into the first region of the photo diode, such that an upper surface of a top side of the second region is exposed on the semiconductor substrate and a bottom side of the second region is in contact with the first region of the photo diode; and (e) forming a connection window region connecting the second region of the photo diode to the semiconductor substrate by ion-injecting the first dopant into the exposed portion of the semiconductor substrate.

5. The method as recited in claim 4, wherein step (d) further comprises the steps of:

forming a photo resist pattern that exposes the second region of the photo diode and the exposed portion of the semiconductor substrate;

ion-injecting the first dopant by using the photo resist pattern as an ion-injection mask; and removing the photo resist pattern.

* * * * *